(12) United States Patent
Watanabe et al.

(10) Patent No.: US 6,265,085 B1
(45) Date of Patent: Jul. 24, 2001

(54) BONDING MATERIAL AND BUMP

(75) Inventors: Tomofumi Watanabe, Ohtsu; Itsuroh Shishido, Shiga-ken, both of (JP)

(73) Assignee: International Business Machines Coporation, Armonk, NY (US)

( * ) Notice: Subject to any disclaimer, the term of this patent is extended or adjusted under 35 U.S.C. 154(b) by 0 days.

(21) Appl. No.: 09/481,904

(22) Filed: Jan. 12, 2000

(30) Foreign Application Priority Data

Jan. 26, 1999 (JP) .................................................. 11-016566

(51) Int. Cl.[7] ...................... B23K 35/363; B23K 35/365; B23K 103/16
(52) U.S. Cl. ......................... 428/614; 428/643; 428/644; 428/645; 428/647; 428/648; 228/180.22; 228/180.21
(58) Field of Search ..................................... 428/614, 643, 428/644, 645, 647, 648; 228/180.22, 180.21

(56) References Cited

U.S. PATENT DOCUMENTS

| | | | |
|---|---|---|---|
| 4,705,205 | * | 11/1987 | Allen et al. . |
| 4,983,804 | * | 1/1991 | Chan et al. . |
| 5,062,896 | * | 11/1991 | Huang et al. . |
| 5,066,544 | * | 11/1991 | Betrabet et al. . |
| 5,520,752 | * | 5/1996 | Lucey, Jr. et al. . |
| 5,938,957 | * | 8/1999 | Tanahasi et al. . |
| 5,953,814 | * | 9/1999 | Sozansky et al. . |
| 5,965,197 | * | 10/1999 | Jin et al. . |
| 5,971,253 | * | 10/1999 | Gilleo et al. . |
| 6,110,761 | * | 8/2000 | Ahmad . |

OTHER PUBLICATIONS

Semalloy Solder Alloy brochure, front page, Jul. 1968.*

Alloys Unlimited Inc. article, page 3, 1959.*

* cited by examiner

Primary Examiner—Deborah Jones
Assistant Examiner—Jason Savage
(74) Attorney, Agent, or Firm—Lawrence R. Fraley

(57) ABSTRACT

The bonding material for an electronic component comprises a metal material and fine resin particles dispersed in the metal material. Such a material may form an electrical "bump" for the component.

19 Claims, 4 Drawing Sheets

BONDING MATERIAL AND BUMP

FIELD OF THE INVENTION

The present invention relates to a bonding material and a bump of an electronic component, and more particularly, it relates to a bonding material which assures a strongly bonded part.

BACKGROUND OF THE INVENTION

When electrically connecting between electronic components with a bonding material composed of a metal such as a solder, the bonding material is first heat-melted to bond the electronic components to each other, and then cooled until solidification occurs. As is known, the bonding material expands during the heat-melting, and contracts during the cooling. Where the bonding material has a high strength, however, an internal stress induced in a connecting portion formed of the bonding material cannot resiliently be absorbed by the connecting portion alone. In addition, the connecting portion suffers from stresses such as thermal fatigue due to heat from an ambient temperature and other environmental conditions as well as heat generated by the components during operation. This may result in cracking of the connecting portion, breakage or separation of the interconnection between the electronic components, or breakage of an insulating layer, which in turn leads to breakdown of the electronic components interconnected by the bonding material. Therefore, the reliability of the whole electronic system may be significantly reduced.

There have been proposed a variety of approaches to the aforesaid problem, one of which is to use a soft metal as the bonding material. Conventionally, lead is mainly used for this purpose. Although lead is excellent in physical properties, limitations are imposed due to environmental problems. Indium is also a typical soft metal which is comparable to lead. However, indium is expensive because of its low production, and has a lower melting point, so that applications thereof are limited.

Another approach is to use a metal-coated resin ball as the bonding material. For example, a solder-plated resin ball is used as a bonding material for a BGA (ball grid array) module. However, the solder-plated resin ball has a relatively large continuous resin-solder interface, so that cracking due to fatigue may propagate along the interface.

It is believed that a bonding material and resulting interconnection structure that overcomes the aforementioned problems will represent significant contributions to the art.

OBJECTS AND SUMMARY OF THE INVENTION

An object of the present invention is to provide a bonding material which has properties comparable to a soft metal and which can be used in a wide range of applications.

Another object of the present invention is to provide a bonding material which, when embodied as a resin ball, can substantially prevent propagation of separation or cracking in a resin-metal interface.

According to one aspect of the invention, there is provided a bonding material which comprises a metal material with fine resin particles dispersed in the metal material.

According to another aspect of the invention, there is provided a bonding material comprising particles comprised of a metal material, fine resin particles and flux.

According to yet another aspect of the invention, there is provided a bonding material which comprises particles and flux, wherein the particles comprise metal particles and one or more fine resin particles encapsulated in particles comprised of metal material.

According to still another aspect of the invention, there is provided a bump for an electronic component wherein the bump comprises a metal material and a plurality of fine resin particles encapsulated in the metal material.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals may be used to indicate like elements from Figure to Figure.

In accordance with one embodiment of the present invention, there is provided a bonding material which comprises a metal material and fine particles of a resin material dispersed in the metal material. The bonding material of the present invention has a thermal fatigue resistance and an internal stress resistance which are virtually comparable to the conventional soft bonding material. The fine particles permit deformation of the metal material, thereby suppressing an increase in the internal stress of the bonding material and reducing stresses such as thermal fatigue. Further, separation or cracking induced in an interface between a fine particle and the metal material is confined within the interface, and is prevented from propagating throughout the entire metal material to reach interfaces between other fine particles and the metal material. The resin particles to be dispersed in the metal material are of a spherical or irregular shape, and may each be metal-coated so as to impart an improved adhesion to the metal base material. A bonding material and a bump for an electronic component according to the present invention will hereinafter be described by way of embodiments thereof with reference to the above drawings.

Figure 1:
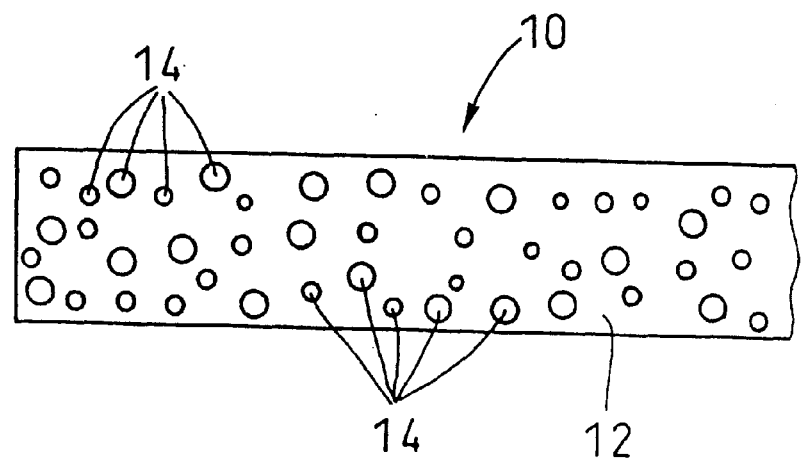
FIG. 1 is an enlarged sectional view illustrating an embodiment of the bonding material for an electronic component according to one embodiment of the present invention.

The bonding material according to another embodiment of the present invention comprises a metal material and fine particles of a resin material dispersed in the metal material. In accordance with one major embodiment of the present invention, the bonding material can be provided as a rod, wire, ingot or the like, and be obtained by mixing fine resin particles with a heat-melted metal material and cooling and forming the resulting mixture. As shown in FIG. 1, for example, the cylindrical rod-shaped bonding material 10 has a cross-sectional configuration clearly showing the fine resin particles 14 dispersed in the host metal material 12. The rod- or wire-shaped bonding material 10 is preferably used for formation of a bump or the like, while the ingot form may be used for flow soldering.

Examples of the metal material 12 to be used as a base material for bonding material 10 include eutectic solders (e.g., Sn:Pb=63:37 (wt %), Sn:Ag=96.5:3.5), alloys such as a ternary alloy of Sn—Pb—Bi (8wt %), and single component metals such as indium, gold, silver and tin.

The resin material for the fine particles 14 is selected from resin materials which have a sufficient heat resistance to be free from decomposition when the bonding material 10 is heat-melted, examples thereof including polyimides, acrylic rubbers and guanidine resins. It is preferred that the fine particles 14 are soft to permit deformation of the metal material 12 which may occur due to contraction thereof, and have a sufficiently lower elastic modulus than the metal material. The fine particles 14 each have such a particle diameter that, when a bump is formed of the bonding material, a sufficient number of fine particles 14 are contained in the bump. More specifically, the fine particles typically have an average particle diameter of not greater than about 20% (preferably 1% to 15%, and more preferably 2% to 10%), of the length of a connecting portion formed by the bonding material which bonds two objects together. If the average particle diameter of the fine particles 14 is too small in comparison with the size of the connecting portion, it is substantially difficult to effect deformation of the metal material 12. If the average particle diameter is too large, conversely, it is impossible to prevent the propagation of the separation or cracking induced in an interface between a fine particle 14 and the metal material 12. The fine particles 14 are not limited to a spherical shape, as shown, but may be irregularly shaped, e.g., in an oval or rectangular sectional configuration or in a short fiber form. The fine particles having the desired shape may be present in combination in the metal material. The kind of resin material for the fine particles is not limited to a single type, but fine particles composed of two or more kinds of resin materials may be dispersed in the metal material.

If an excessively great amount of fine particles 14 are dispersed in the metal material 12, the resulting bonding material undesirably has an increased electrical resistance and forms a lower-strength connecting portion. An excessively small amount of fine particles 14 is not preferable because a desired result expected from the dispersion of the fine particles 14 is lost and a connecting portion formed of the resulting bonding material may suffer from various defects. Therefore, the amount of the fine particles 14 to be dispersed in the metal material 12 is typically not greater than about 40 vol % (preferably 1 vol % to 40 vol %, and more preferably 5 vol % to 25 vol %), based on the amount of metal material 12. The expression "40 vol %", for example, herein means that 40 parts by volume of the fine particles are present in 100 parts by volume of the metal material.

Figure 2:
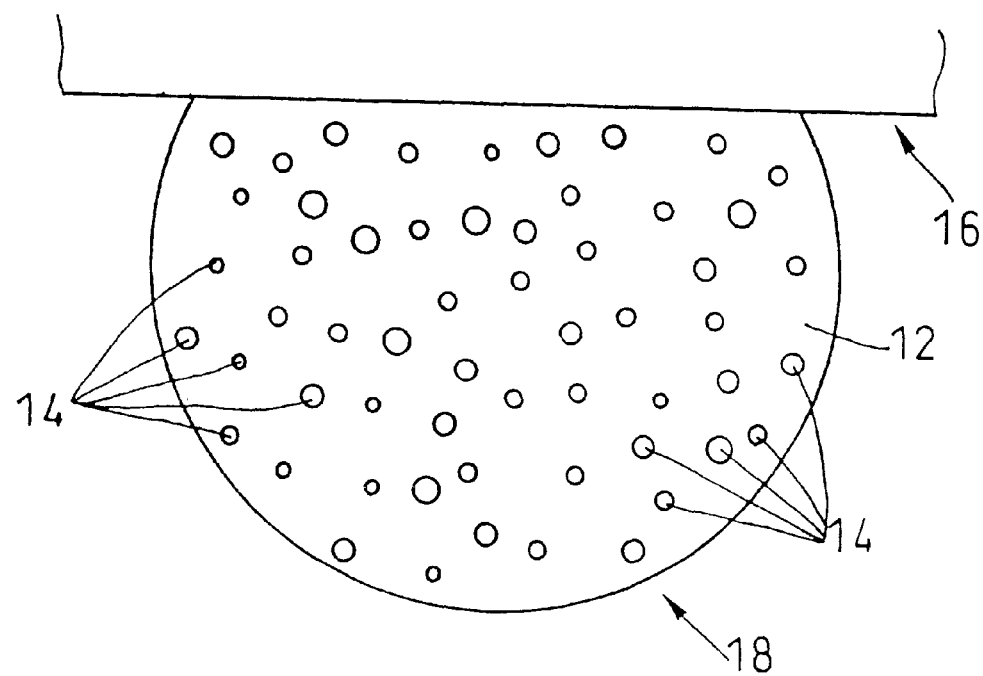
FIG. 2 is an enlarged sectional view of the bump of one embodiment of the present invention.

Bonding material 10 having the aforesaid features is preferably used in the formation of a bump 18 for an electronic component 16, as shown in FIG. 2. In bump 18, the fine particles 14 are shown as being dispersed in the metal material 12. The bump 18 is reflowed to bond the electronic component to a circuit on a board or card (not shown). Even if the metal material 12 has high strength, a stress induced by deformation of the metal material due to contraction thereof by cooling is reduced by the presence of the fine particles 14, so that the connecting portion as well as the electronic component 16 and the board are free from breakdown. More specifically, even if the metal material 12 is hard, it can be turned into soft metal material by dispersing the fine particles 14 in the metal material 12. Even if separation or cracking occurs at an interface between a fine particle 14 and the metal material 12 surrounding the fine particle 14, it is confined to this interface, and is prevented from propagating to interfaces of adjacent fine particles 14.

Figure 3:
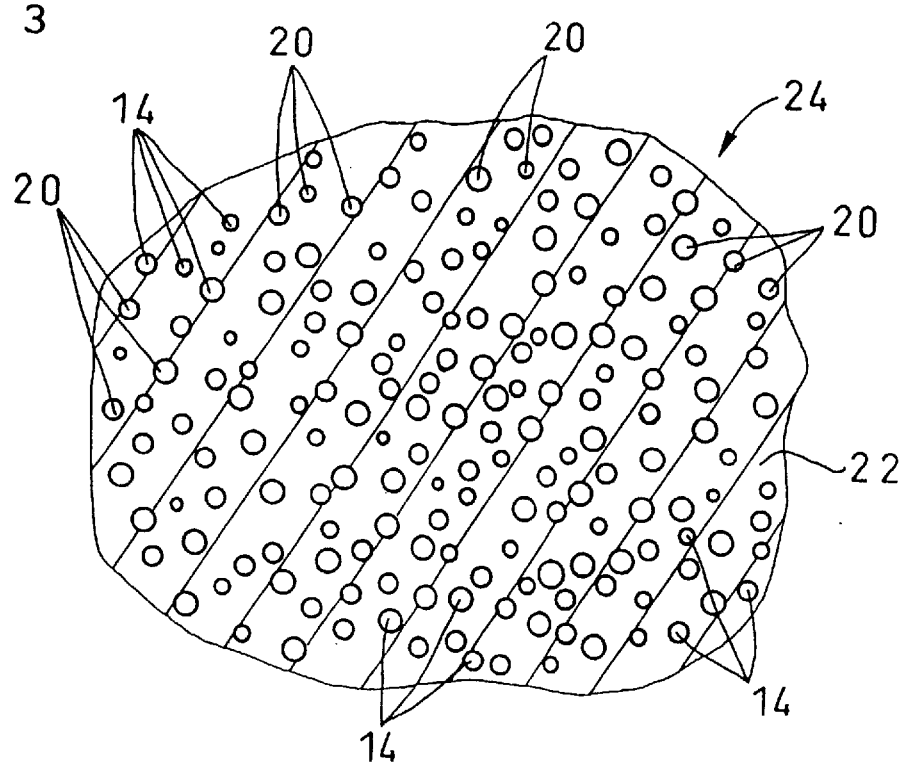
FIG. 3 is an enlarged sectional view illustrating another embodiment of the bonding material for an electronic component of the present invention.
Figure 4:
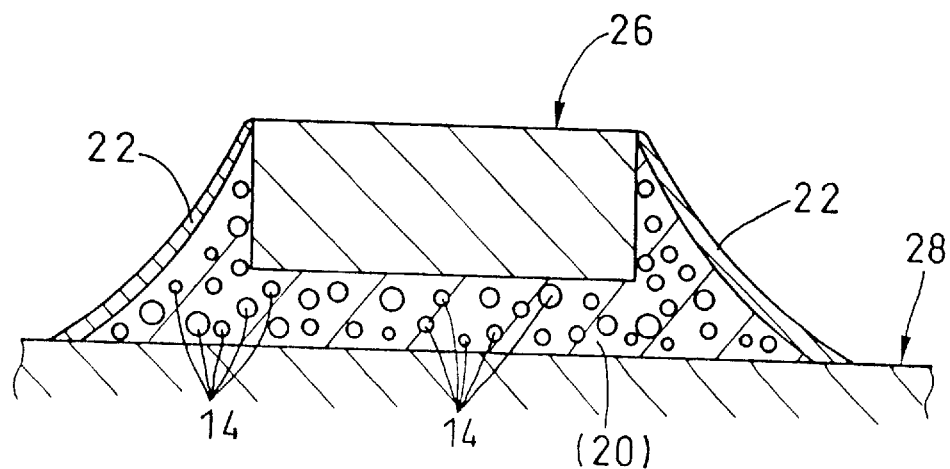
FIG. 4 is an enlarged sectional view, illustrating the connecting portion where electronic components are bonded to each other with the bonding material of the present invention.

In accordance with another embodiment of the present invention, a bonding material for an electronic component comprises particles 20 of a metal material which later serves as a base material, fine particles 14 of a resin material, and flux 22 (as shown in FIG. 3) and is provided as a paste which is obtained by homogeneously mixing these components with each other. The pasty bonding material 24 is applied onto a connection surface, then heated to achieve melting of the metal particles 20, and thereafter cooled for bonding electronic components 26 and 28 to each other (as shown in FIG. 4). At this time, the fine resin particles 14 are incorporated in the melted metal material (20), which is in turn solidified in this state. The resulting connecting portion offers the same action and effect as the above-mentioned connecting portion. The bonding material 24 comprising the metal particles 20, the fine resin particles 14 and the flux 22 is not necessarily required to be pasty. For example, flux 22 in a solid state at an ordinary temperature may be used to provide a solid bonding material 24.

Figure 5:
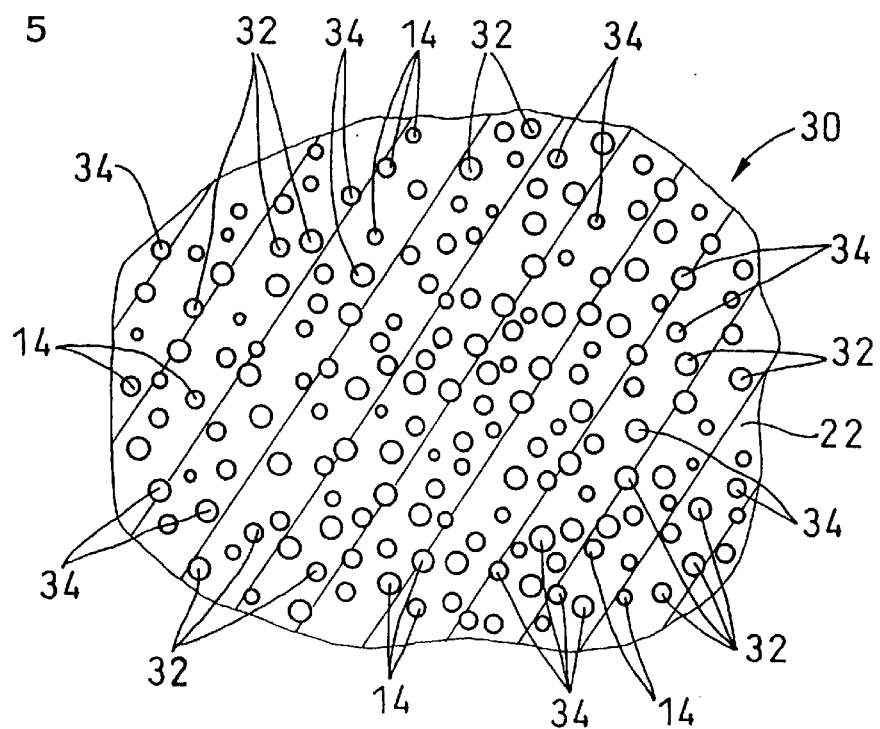
FIG. 5 is an enlarged sectional view, illustrating still another embodiment of the bonding material for an electronic component of the present invention.

Further, the metal particles 20 may be comprised of a single kind of metal, or an alloy of several different metals. Where the base material for a bonding material 30 is a metal alloy, plural kinds of metal particles 32, 34 (FIG. 5) may be used in combination. In this case, the plural kinds of metal particles 32, 34 are mixed in a predetermined ratio, and formed into the predetermined alloy when the bonding material is heated for melting the metal particles. Therefore, the bonding material 30, after having been heat-melted, has a construction substantially as shown in FIGS. 2 or 4.

Figure 6:
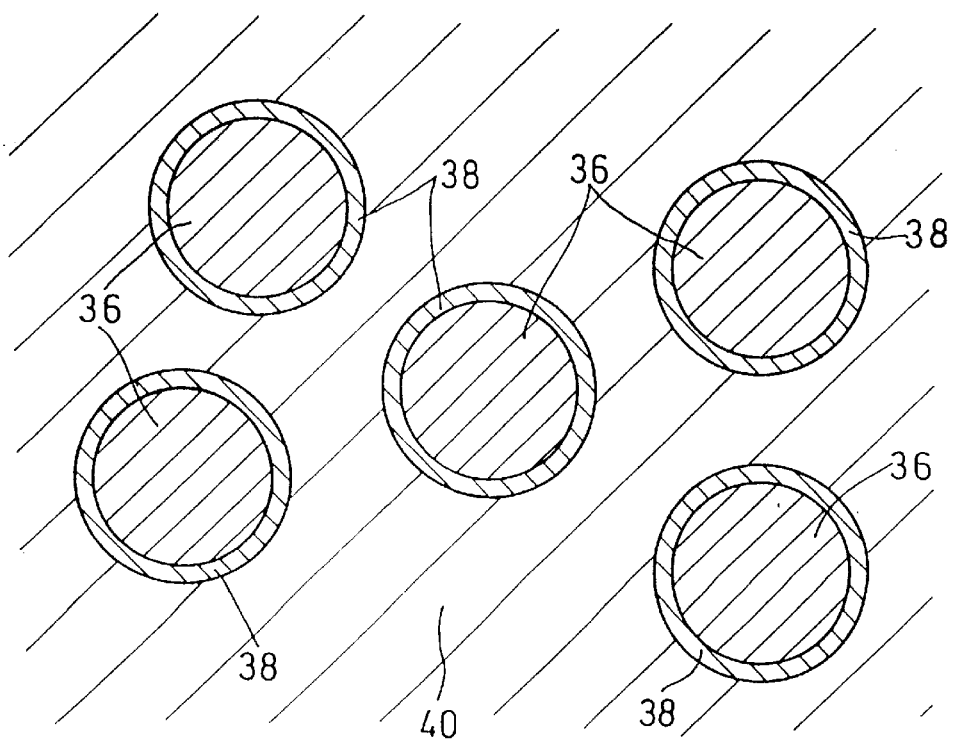
FIG. 6 is an enlarged sectional view, illustrating a further embodiment of the bonding material for an electronic component of the present invention.
Figure 7:
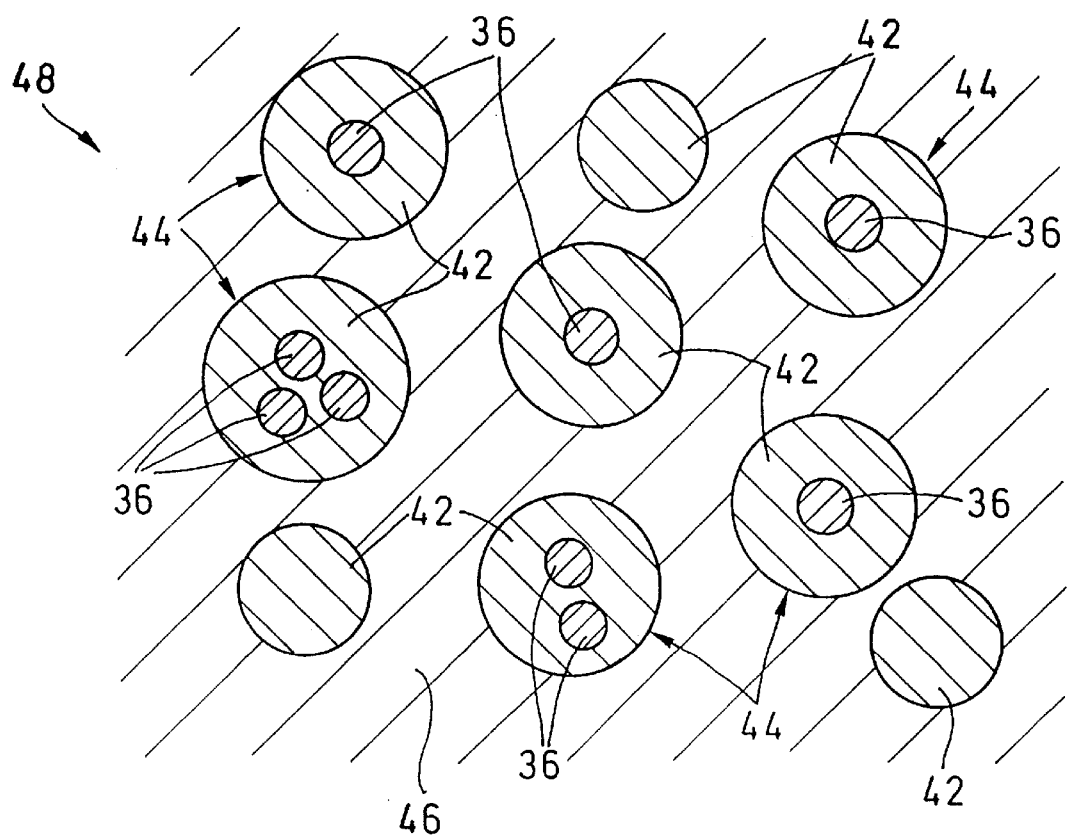
FIG. 7 is an enlarged sectional view illustrating a still further embodiment of the bonding material for an electronic component of the present invention.

In the embodiments previously described, fine resin particles 36 may be preferably coated with a metal 38 different from the metal material to be used as the base material for the bonding material, this being shown in FIG. 6. As seen in FIGS. 6 and 7, fine resin particles 36 are solid in cross-sectional configuration. As seen in FIGS. 6 and 7, fine resin particles are solid in cross-section. Where the metal 38 has a melting point higher than the metal material 40 to be used as the base material for the bonding material, the fine particles 36 are protected by being coated with the metal 38 even if the fine particles 36 have a softening temperature lower than the melting point of the metal material 40. The coating metal 38 preferably has a good adhesion to the metal material 40 and a high strength. In this case, the fine particles 36 rarely protrude from the melted metal material 40. Even if a large internal stress is induced in the metal material, the bonding material does not suffer from separation at an interface between the metal material 40 and the coated metal 38.

It is also possible that the fine resin particles 36 may be coated with a metal 42 of the same kind as the metal material (42) to be used as the base material for the bonding material, as shown in FIG. 7. In this embodiment, the bonding material 48 preferably comprises particles 44 each including a fine resin particle 36 coated with a thick layer of the metal 42, and flux 46. In this case, the fine resin particles 36 are preliminarily encapsulated in the metal 42, so that the fine particles 36 do not protrude from the metal material 42 when the layers of the metal 42 of the particles 44 are melted. The number of fine particles 36 to be encapsulated in each particle 44 having the coating layer of the metal 42 is not limited to one, but may be two or more.

The coating of the fine resin particles 36 with the metal of the kind same as or different from the metal material to be used as the base material for the bonding material may be achieved by a known technique, such as plating. For example, one or more fine particles as a nucleus are dispensed in a metal powder, and then baked for the coating.

Figure 8:
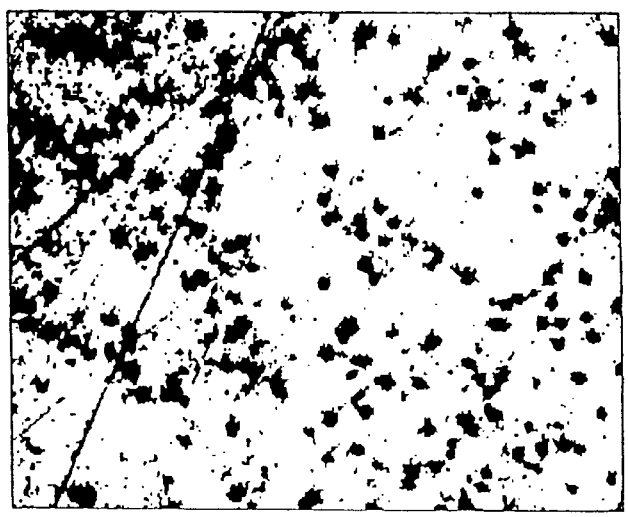
FIG. 8 is a photomicrograph, showing an enlarged sectional view of the bonding material of one embodiment of the invention.

An eutectic solder composed of 63Sn/37Pb was used as a metal material which served as a base material for a bonding material. Fine particles having an average diameter of 5 micrometers were dispersed in that solder. FIG. 8 is an enlarged sectional view of the bonding material. In the drawing, black parts indicate resin particles. As shown in FIG. 8, resin particles are dispersed well in the metal base material.

The embodiments of the bonding material for an electronic component according to the present invention have thus been described with reference to the drawings; however, the present invention is not limited to these illustrated embodiments. In particular, the metal material is not necessarily required to provide an electrically conductive path, e.g., it may merely serve as a bonding material for physically bonding structural components to each other.

The properties of the bonding material according to the present invention can be controlled for an intended purpose by properly selecting the base metal material, the resin material for the fine particles to be dispersed, the surface-treatment method for the fine resin particles, the size of the fine particles, and the amount of the fine particles to be added. In this manner, various modifications, alterations and changes may be made to the embodiments on the basis of knowledge of those skilled in the art without departing from the scope of the present invention.

The bonding material for an electronic component according to the present invention comprises a metal material and fine resin particles dispersed in the metal material. Therefore, the bonding material of the present invention may have properties comparable to the soft metal with virtually no preference in a base metal to be contained therein, and can be used in a wide range of applications. Further, the bonding material of the present invention can prevent propagation of separation or cracking in a resin-metal interface by the high-strength base metal material contained therein, especially when embodied as a resin ball. Furthermore, the bonding material of the present invention contains less amount of metal material, so that cost reduction can be achieved.

What is claimed is:

1. A solder bonding material for bonding first and second electronic components, said bonding material comprising:
   a base metal solder material; and
   fine resin particles dispersed in said base metal solder material.

2. The solder bonding material according to claim 1, wherein said base metal solder material comprises a eutectic solder.

3. The solder bonding material according to claim 1 wherein said fine resin particles have an elastic modulus that is lower than the elastic modulus of said base metal solder material.

4. The solder bonding material according to claim 1, wherein said fine resin particles are selected from the group of materials consisting of polyimides, acrylic rubbers and guanidine resins.

5. The solder bonding material according to claim 1, wherein said fine resin particles comprise about 1 percent to about 40 percent of the volume of said solder bonding material.

6. The solder bonding material according to claim 5, wherein said fine resin particles comprise from about 5 percent to about 25 percent of the volume of said solder bonding material.

7. The solder bonding material of claim 1 further including a flux.

8. The solder bonding material according to claim 1, wherein said fine resin particles are of a substantially spherical shape or an irregular shape, and are substantially solid in cross-section.

9. The solder bonding material according to claim 1, wherein said fine resin particles are each coated with a metal different than the metal of said base metal solder material.

10. An electrical assembly comprising:
    a first electronic component;
    a second electronic component; and
    a solder bonding material electrically bonding said first and second electronic components said solder bonding material includes a base metal solder material and fine resin particles dispersed in said base metal solder material.

11. The electrical assembly according to claim 10, wherein said first electronic component is a ball grid array module.

12. The electrical assembly according to claim 10 wherein said base metal solder material comprises a eutectic solder.

13. The electrical assembly of claim 10 wherein said fine resin particles have an elastic modulus that is lower than the elastic modulus of said base metal solder material.

14. The electrical assembly of claim 10 wherein said fine resin particles are selected from the group of materials consisting of polyimides, acrylic rubbers and guanidine resins.

15. The electrical assembly of claim 10 wherein said fine resin particles comprise about 1 percent to about 40 percent of the volume of said solder bonding material.

16. The electrical assembly of claim 15 wherein said fine resin particles comprise from about 5 percent to about 25 percent of the volume of said solder bonding material.

17. The electrical assembly of claim 10 wherein said solder bonding material further includes a flux.

18. The electrical assembly of claim 10 wherein said fine resin particles are of a substantially spherical shape or an irregular shape and are substantially solid in cross-section.

19. The electrical assembly of claim 10 wherein said fine resin particles are each coated with a metal different than the metal of said base metal solder material.

* * * * *